(12) United States Patent
Yuan et al.

(10) Patent No.: US 8,191,613 B2
(45) Date of Patent: Jun. 5, 2012

(54) THERMAL MODULE WITH QUICK ASSEMBLING STRUCTURE

(75) Inventors: Mei-Hua Yuan, Sinjhuang (TW); Li-Hua Li, Sinjhuang (TW)

(73) Assignee: Asia Vital Components Co., Ltd., Taipei County (TW)

( * ) Notice: Subject to any disclaimer, the term of this patent is extended or adjusted under 35 U.S.C. 154(b) by 556 days.

(21) Appl. No.: 12/371,693

(22) Filed: Feb. 16, 2009

(65) Prior Publication Data

US 2010/0206524 A1 Aug. 19, 2010

(51) Int. Cl.
*F28F 7/00* (2006.01)
*H05K 7/20* (2006.01)
(52) U.S. Cl. .......................... 165/80.3; 165/67; 165/121
(58) Field of Classification Search ................. 165/80.3, 165/104.34, 67, 121; 361/695, 697
See application file for complete search history.

(56) References Cited

U.S. PATENT DOCUMENTS

| 5,421,402 | A | | 6/1995 | Lin | |
|---|---|---|---|---|---|
| 5,590,025 | A | | 12/1996 | Clemens | |
| 5,597,034 | A | * | 1/1997 | Barker et al. | 165/80.3 |
| 6,662,412 | B2 | * | 12/2003 | Chuang et al. | 24/457 |
| 2005/0207119 | A1 | * | 9/2005 | Huang | 361/697 |
| 2007/0121293 | A1 | * | 5/2007 | Hong et al. | 361/697 |
| 2007/0242433 | A1 | * | 10/2007 | Lin et al. | 361/697 |
| 2008/0130228 | A1 | * | 6/2008 | Zhou et al. | 361/697 |
| 2008/0302507 | A1 | * | 12/2008 | Chen | 165/80.3 |
| 2009/0244844 | A1 | * | 10/2009 | Liao et al. | 361/697 |

* cited by examiner

*Primary Examiner* — Tho V Duong

(57) ABSTRACT

A thermal module includes a heat sink and a cooling fan. The heat sink has a main body, from an outer periphery thereof a plurality of radiating fins and at least one fixing section are outward extended. The fixing section is provided on one lateral side with at least one first mating part. The cooling fan has a housing having a blade hub arranged therein. The housing is provided on one side facing toward the heat sink with at least one second mating part and an axially raised wall portion. The raised wall portion is pressed against the heat sink to thereby define a space between the cooling fan and the heat sink. The cooling fan and the heat sink can be quickly assembled together through engagement of the first and the second mating part with one another to reduce the material and labor costs of the thermal module.

8 Claims, 19 Drawing Sheets

THERMAL MODULE WITH QUICK ASSEMBLING STRUCTURE

FIELD OF THE INVENTION

The present invention relates to a thermal module, and more particularly to a thermal module having a cooling fan and a heat sink that can be quickly assembled together at reduced material and labor costs through engagement of first and second mating parts.

BACKGROUND OF THE INVENTION

With the quick development in the electronic industrial field, the electronic elements in a computer can have largely increased operating speed now. However, the electronic elements also produce an extremely high amount of heat when they operate at high speed. Thus, it is always an important task of the electronic product manufacturers to work out a way for effectively dissipating the heat produced by the operating electronic elements to ensure the normal operation of the electronic products. As it is known, the central processing unit (CPU) is the core of a computer system, the performance of the CPU has direct influence on the computer performance. Similarly, when the computer runs, the CPU thereof will also produce a large amount of heat. When the produced heat is too high, the CPU might not be able to operate normally and cause undesirable shutdown of the computer.

For the purpose of effectively dissipating the heat produced by the CPU during the operation thereof, a thermal module is usually mounted to the CPU. The thermal module mainly includes a cooling fan and a heat sink. The cooling fan is locked to the heat sink, and the heat sink is mounted on the CPU. While the heat produced by the CPU during the operation thereof is transferred to and then radiated from the heat sink, the cooling fan operates to produce and force airflows toward the heat sink to constantly carry the heat away from the heat sink. Thus, the CPU is protected against lowered working efficiency due to overheating.

FIG. 1A is an assembled perspective view of a first conventional thermal module, which includes a cooling fan 10, a mounting rack 11, and a heat sink 12. The cooling fan 10 is connected to one side of the mounting rack 11. For this purpose, the cooling fan 10 is provided at four corners with a through hole 101 each. The mounting rack 11 is fitted around an upper part of the heat sink 12 to locate between the cooling fan 10 and the heat sink 12. One side of the mounting rack 11 facing toward the cooling fan 10 is formed of four projected posts 111 for engaging with the through holes 101 on the cooling fan 10. One side of the heat sink 12 opposite to the mounting rack 11 is in contact with a heat-producing electronic element (not shown). That is, the cooling fan 10 is mounted atop the heat sink 12 via the mounting rack In producing the first conventional thermal module, the cooling fan 10 must always be connected to the heat sink 12 via the mounting rack 11. Therefore, in assembling the first conventional thermal module, additional procedures of connecting the mounting rack 11 to the cooling fan 10 and the heat sink are required, which will inevitably result in increased production cost and lengthened time for assembling. Due to the additional mounting rack 11, the assembling efficiency in producing the first conventional thermal module is relatively low.

FIG. 1B is an assembled perspective view of a second conventional thermal module, which includes a cooling fan 10, a bridging member 11, and a heat sink 12. The cooling fan 10 is provided at four corners with a through hole 101 each, and the bridging member 11 is provided on one side facing toward the cooling fan 10 with a plurality of projected posts 111. Therefore, the cooling fan 10 can be connected to one side of the bridging member 11 through engagement of the through holes 101 with the projected posts 111. The bridging member 11 can be a connecting seat, for example, for mounting to an upper side of the heat sink 12 and is therefore located between the cooling fan 10 and the heat sink 12. The heat sink 12 has a lower side in contact with a heat-producing electronic element (not shown). That is, in the second conventional thermal module, the cooling fan 10 is mounted atop the heat sink 12 via the bridging member 11.

In producing the second conventional thermal module, the cooling fan 10 and the heat sink 12 are connected to each other with the bridging member 11 serving as a bridge between them. Therefore, in assembling the second conventional thermal module, additional procedures of connecting the bridging member 11 to the cooling fan 10 and the heat sink 12 are required, which will inevitably result in increased production cost and lengthened time for assembling. Moreover, since the cooling fan 10 must always connected to the heat sink 12 via the bridging member 11, the assembling efficiency in producing the second conventional thermal module is relatively low.

In conclusion, the conventional thermal modules have the following disadvantages: (1) increased production cost; (2) lengthened assembling time; (3) low assembling efficiency; and (4) low heat dissipation effect.

It is therefore tried by the inventor to develop an improved thermal module with quick assembling structure to overcome the drawbacks of the conventional thermal modules.

SUMMARY OF THE INVENTION

A primary object of the present invention is to provide a thermal module with quick assembling structure to enable reduced material and labor costs thereof.

Another object of the present invention is to provide a thermal module with quick assembling structure that enables upgraded assembling efficiency.

A further object of the present invention is to provide a thermal module with quick assembling structure that enables enhanced heat dissipation performance.

To achieve the above and other objects, the thermal module with quick assembling structure according to the present invention includes a heat sink and a cooling fan. The heat sink has a main body and a plurality of radiating fins outward extended from an outer periphery of the main body to space from one another. At least one fixing section is also outward extended from the outer periphery of the main body and at least one first mating part is provided on one lateral side of the fixing section. When there are two or more fixing sections, the radiating fins are divided by the fixing sections into several groups, each of which is located between two adjacent fixing sections. The cooling fan has a housing and a blade hub arranged in the housing. The housing is provided on one side facing toward the heat sink with at least one second mating part corresponding to the first mating part and an axially raised wall portion, which has an outer end face pressing against the heat sink to thereby define a space between the cooling fan and the heat sink. The cooling fan and the heat sink can be quickly assembled together to form the thermal module through engagement of the first and the second mating part with one another. Therefore, the thermal module of the present invention can be assembled in high efficiency and manufactured at reduced material and labor costs.

BRIEF DESCRIPTION OF THE DRAWINGS

The structure and the technical means adopted by the present invention to achieve the above and other objects can be best understood by referring to the following detailed description of the preferred embodiments and the accompanying drawings, wherein.

DETAILED DESCRIPTION OF THE PREFERRED EMBODIMENTS

Please refer to FIGS. 2, 3, 3A, 4, 4A, and 5 at the same time, in which a thermal module with quick assembling structure according to a first preferred embodiment of the present invention is shown. The thermal module includes a heat sink 2 and a cooling fan 3.

Figure 1A:
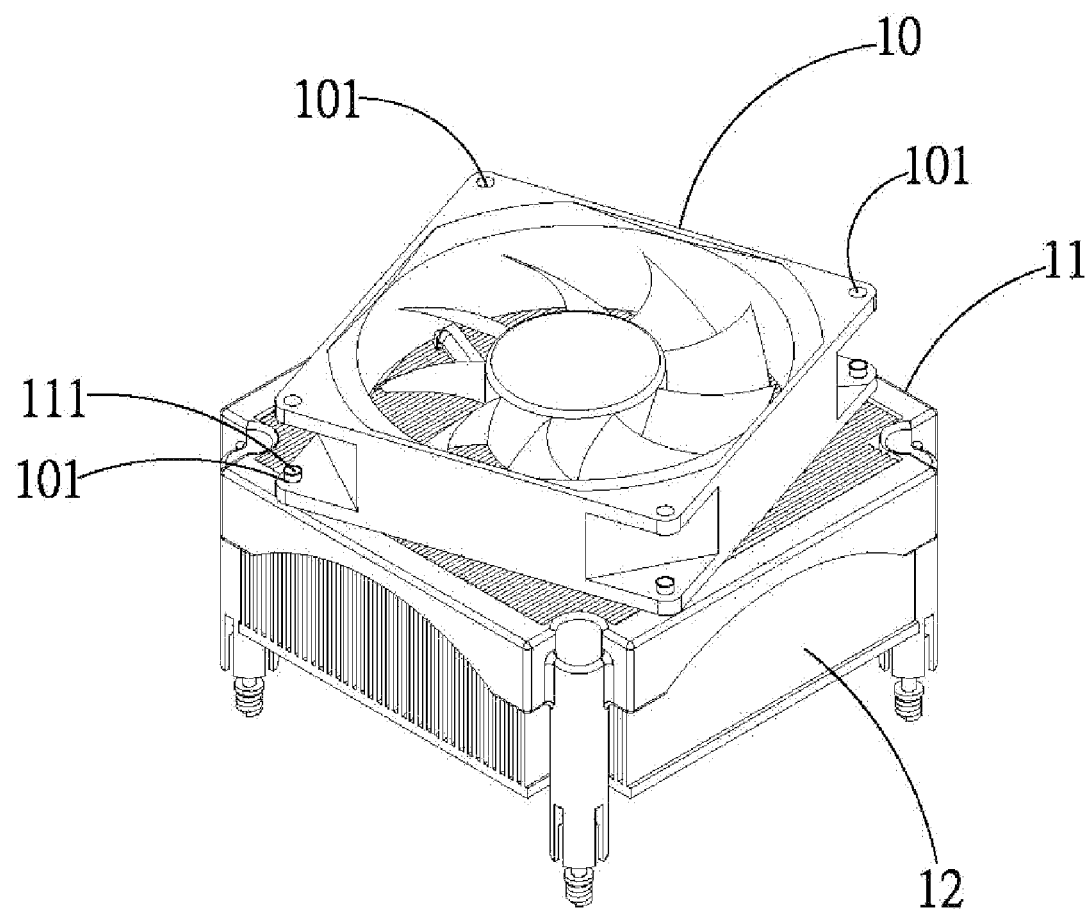
FIG. 1A is an assembled perspective view of a first conventional thermal module.
Figure 1B:
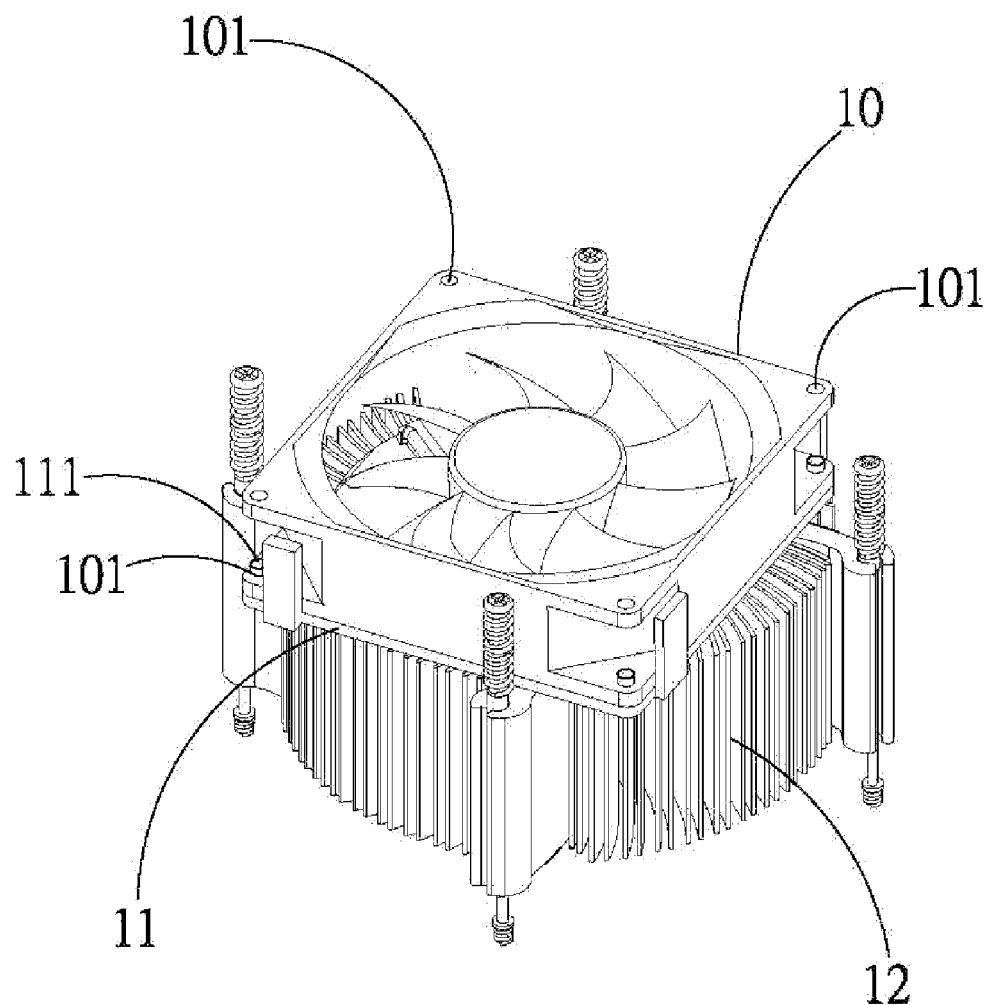
FIG. 1B is an assembled perspective view of a second conventional thermal module.
Figure 2:
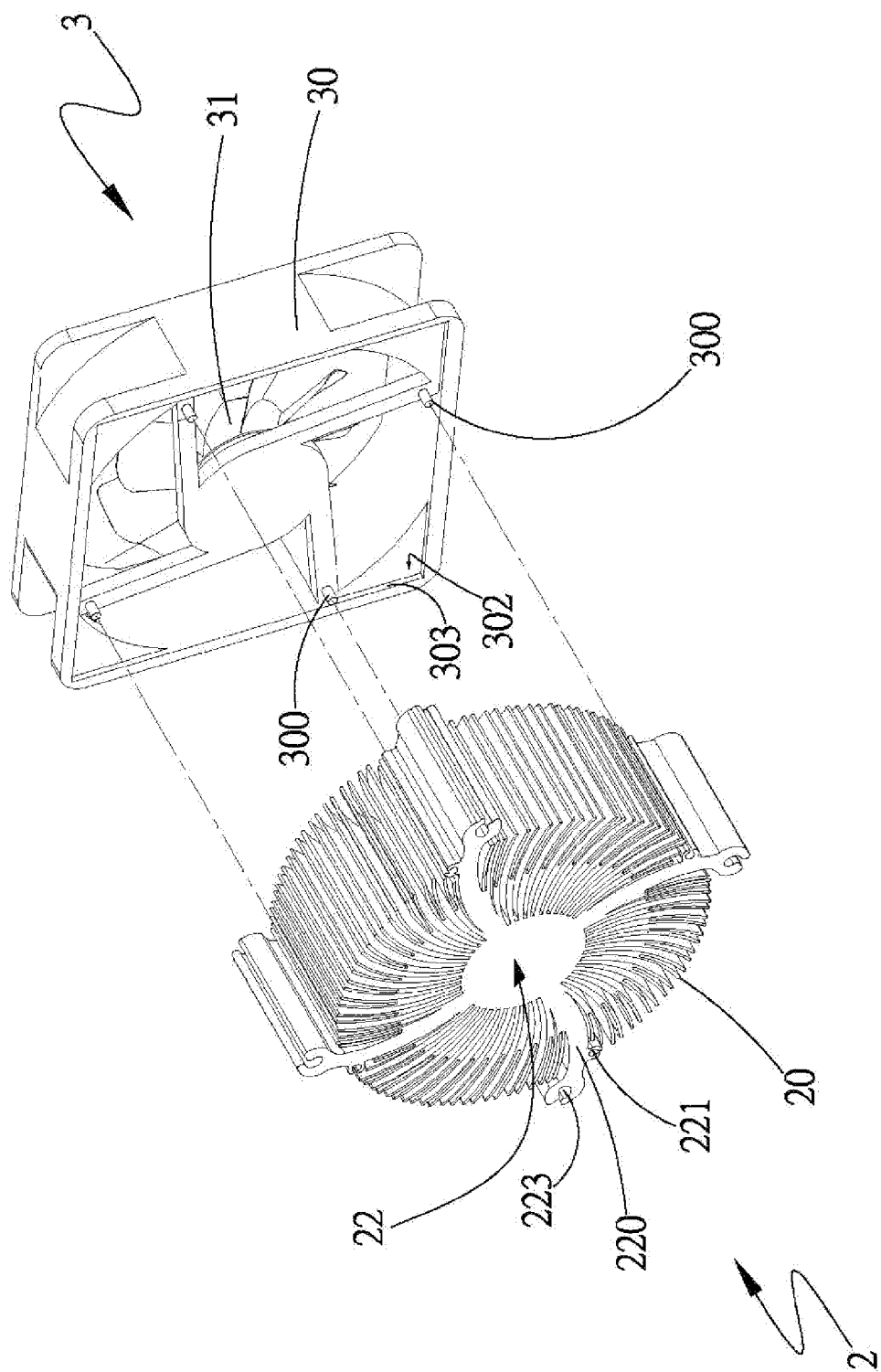
FIG. 2 is an exploded perspective view of a thermal module with quick assembling structure according to a first preferred embodiment of the present invention.
Figure 3:
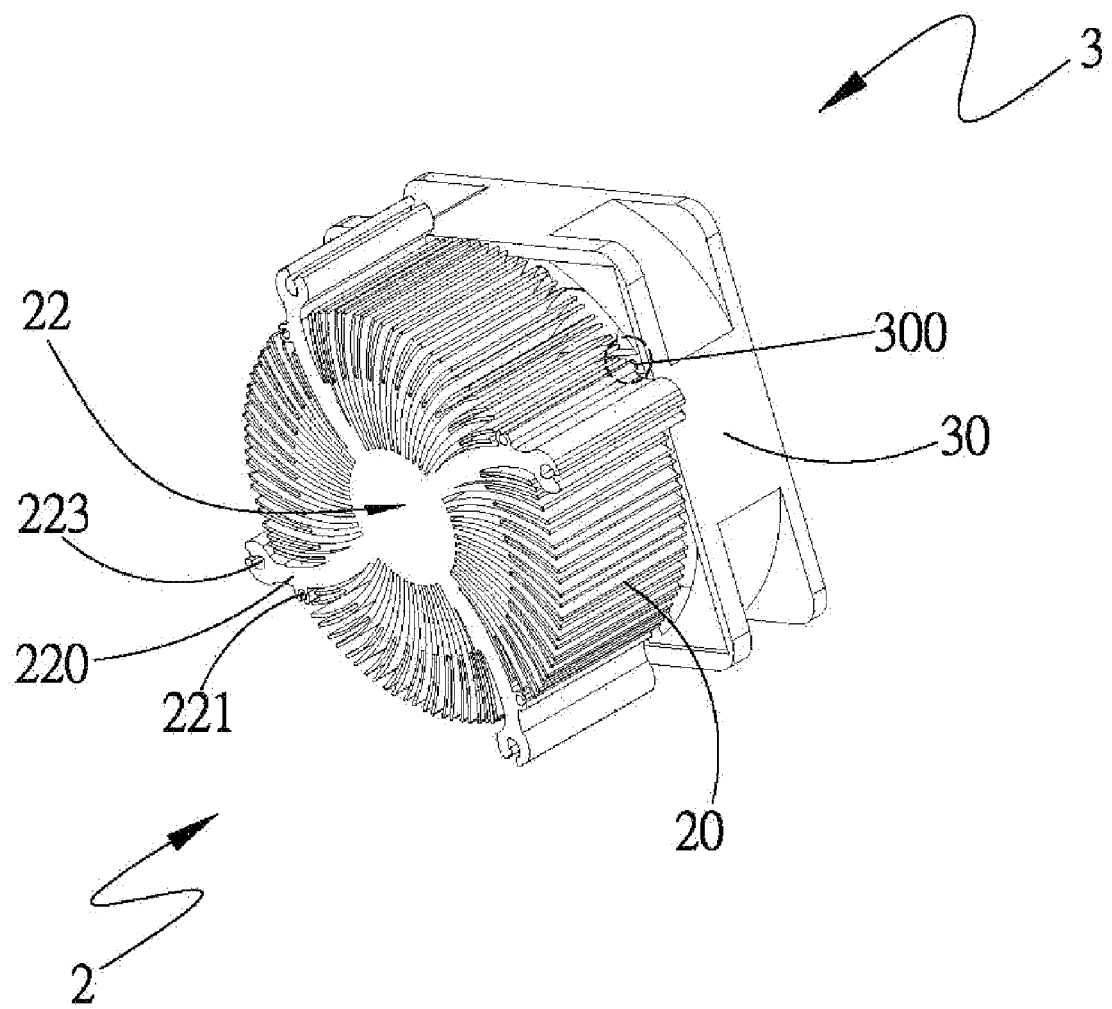
FIG. 3 is an assembled view of FIG. 2.
Figure 3A:
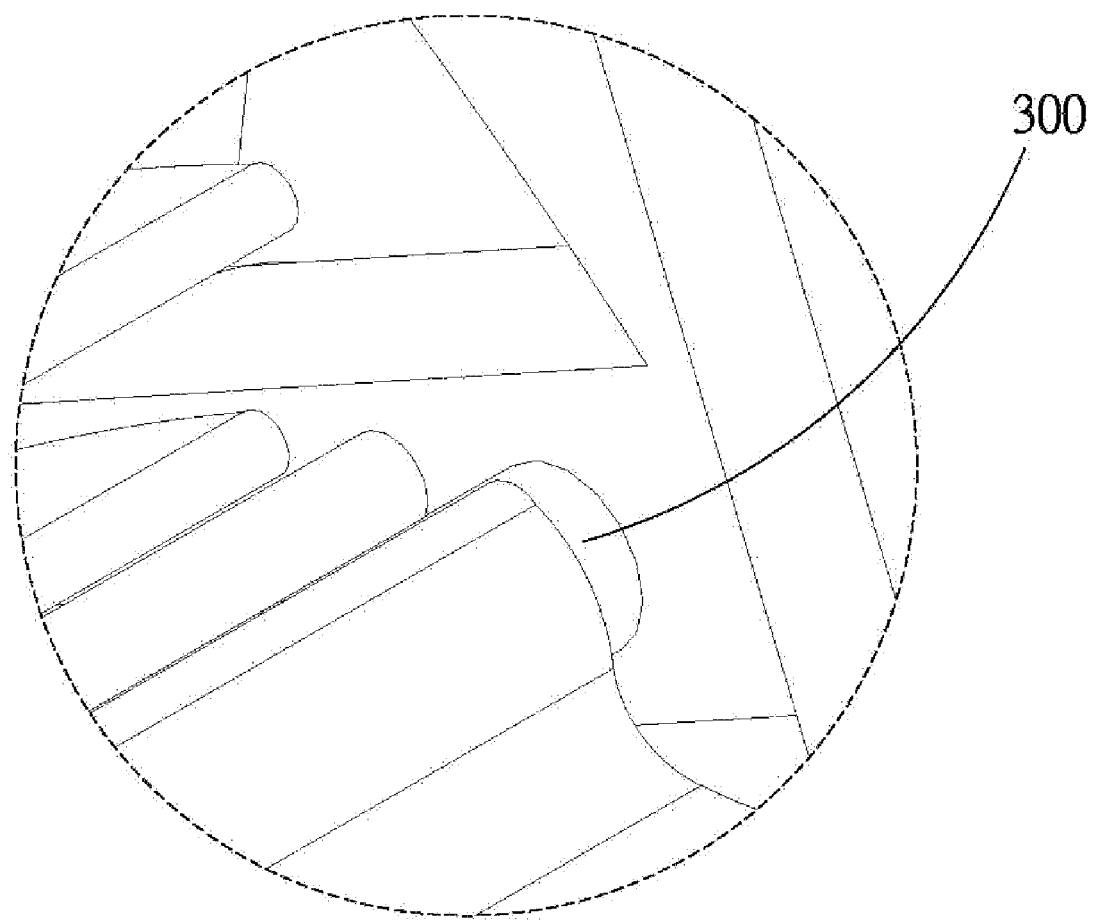
FIG. 3A is an enlarged view of the circled area in FIG. 3.
Figure 4:
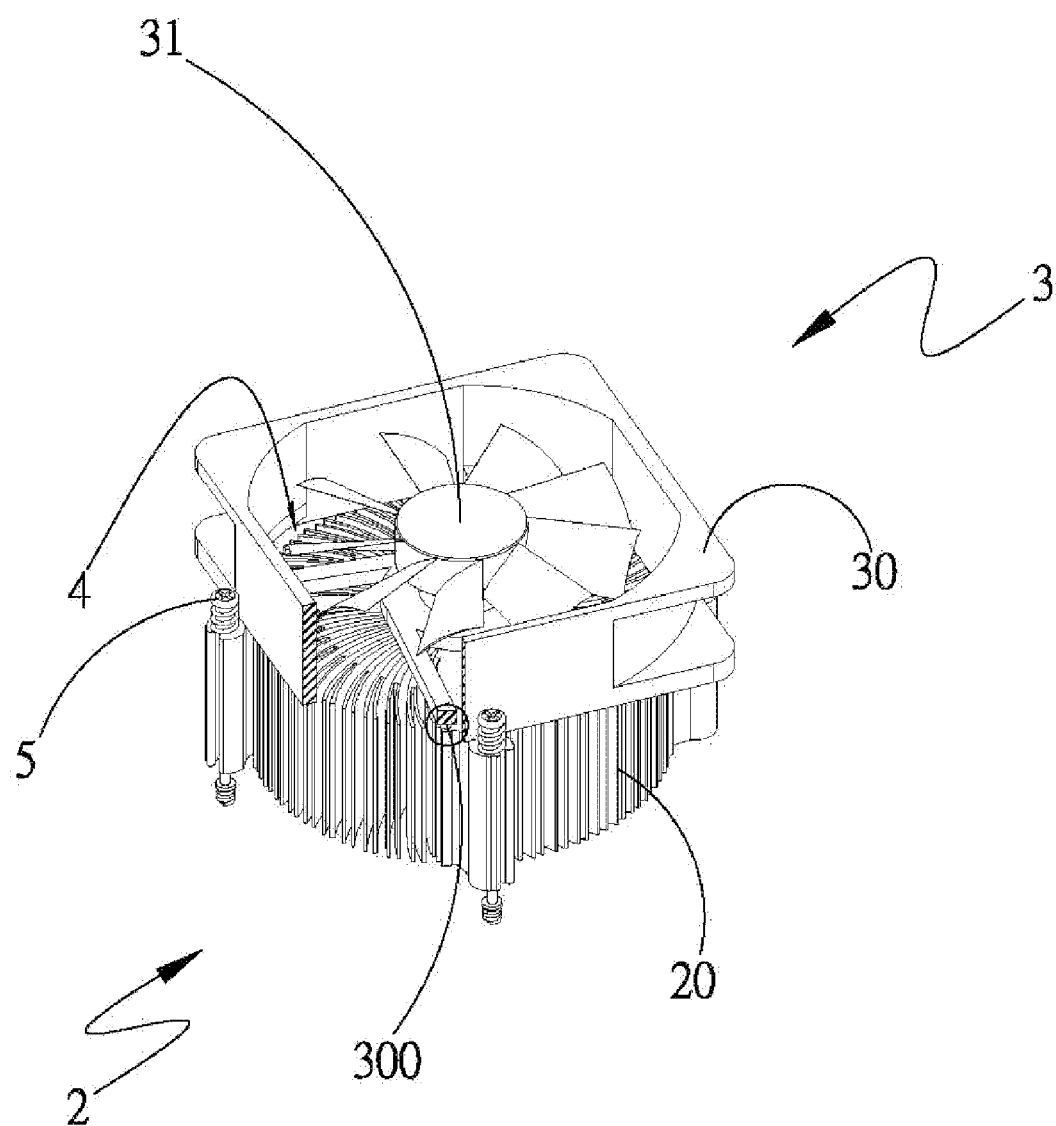
FIG. 4 is a cutaway view of the thermal module according to the first preferred embodiment of the present invention.
Figure 4A:
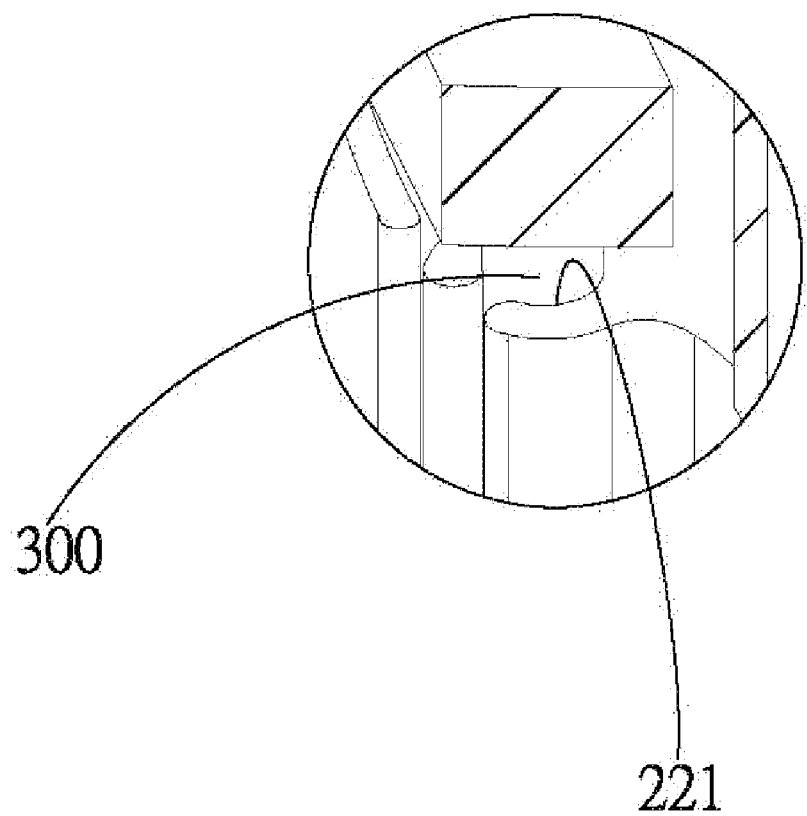
FIG. 4A is an enlarged view of the circled area in FIG. 4.
Figure 5:
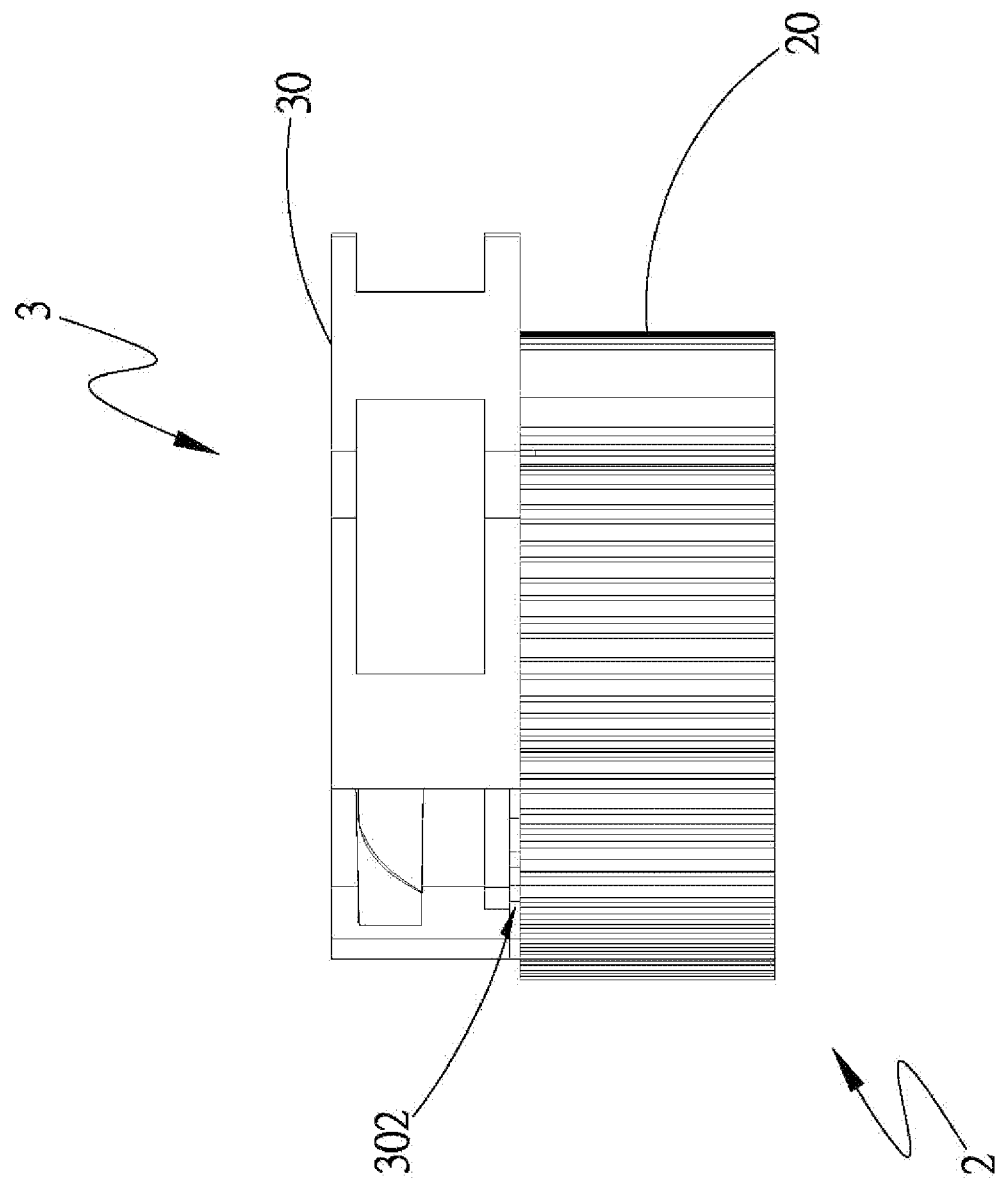
FIG. 5 is an assembled side view of FIG. 2.

The heat sink 2 has a plurality of radiating fins 20 and a main body 22. At least one fixing section 220 is outward extended from an outer periphery of the main body 22. That is, the fixing section 220 has an inner end integrally connected to the main body 22. An outer end of the fixing section 220 is formed into an axially extended fastening hole 223, with which a first fastening element 5 can be engaged, as can be seen in FIG. 4. In the illustrated embodiment, the first fastening element 5 is a screw. The fixing section 220 is also provided at one lateral side with at least one first mating part 221. The radiating fins 20 are outward extended from the outer periphery of the main body 22 to space from one another. When there are two or more fixing sections 220, the radiating fins 20 are divided by the fixing sections 220 into several groups, each of which is located between two adjacent fixing sections 220.

The cooling fan 3 includes a housing 30 and a blade hub 31 arranged in the housing 30. One side of the housing 30 facing toward the heat sink 2 is provided with at least one second mating part 300 corresponding to the first mating part 221 and an axially raised wall portion 302. An axially outer end face 303 of the raised wall portion 302 is in contact with the heat sink 2, so that a space 4 is defined between the cooling fan 3 and the heat sink 2. Further, the first and the second mating part 221, 300 are integrally formed on the fixing section 220 and the housing 30, respectively.

The raised wall portion 302 is provided to increase a distance between the cooling fan 3 and the radiating fins 20, so as to reduce an impact on the radiating fins 20 by a fluid guided from an air outlet of the cooling fan 3 into the heat sink 2. With this arrangement, it is also possible to reduce noise produced by the thermal module during the operation thereof. Since the raised wall portion 302 of the housing 30 defines an area larger than that of one side of the cooling fan 3 having the air outlet, an expanded and sealed airflow passage, that is, the above-mentioned space 4, can be formed between the cooling fan 3 and the radiating fins 20. The sealed airflow passage is formed because the raised wall portion 302 stops the airflow guided in from the air outlet in the cooling fan 3 from flowing outward. Therefore, with the raised wall portion 302, loss of static pressure in the thermal module can be avoided and heat dissipation effect can be increased.

By aligning and engaging the first and the second mating part 221, 300 with one another, the cooling fan 3 can be quickly assembled to the heat sink 2. Therefore, the thermal module according to the present invention not only enables high assembling efficiency, but also enhanced heat dissipation performance. Further, the thermal module of the present invention can also be manufactured at reduced cost and shortened time. In brief, the thermal module of the present invention effectively overcomes the problems of high manufacturing cost and long assembling time, low assembling efficiency, and poor heat dissipation effect as found in the conventional thermal modules.

Please refer to FIGS. 2 through 13A. The first mating part 221 can be a fixing hole or a projected post, and the second mating part 300 can be a projected post or a fixing hole corresponding to the fixing hole or the projected post, respectively, of the first mating part 221. There are different types of combinations available for the first and the second mating part 221, 300. In the present invention, three different combinations of the first and the second mating part 221, 300 are illustrated, a first one of which includes a first mating part 221 in the form of a fixing hole and a second mating part 300 in the form of a projected post for fitly inserting into or engaging with the fixing hole of the first mating part 221, as shown in FIGS. 2, 3, 3A, 4, 4A, 5, and 6. In a second type of combination, the first mating part 221 is a projected post and the second mating part 300 is a fixing hole for correspondingly receiving the projected post of the first mating part 221 therein, as shown in FIGS. 7, 8, 8a, 9, 9A, and 10. And, in a third type of combination, both of the first and the second mating part 221, 300 are fixing holes, through which a second fastening element 6 can be extended to thereby connect the first and the second mating part 221, 300 to one another, as shown in FIGS. 10, 11, 12, 13, and 13A. The second fastening element 6 can be a screw or an insertion pin for screwing or inserting into the aligned fixing holes of the first and second mating parts 221, 300.

Figure 6:
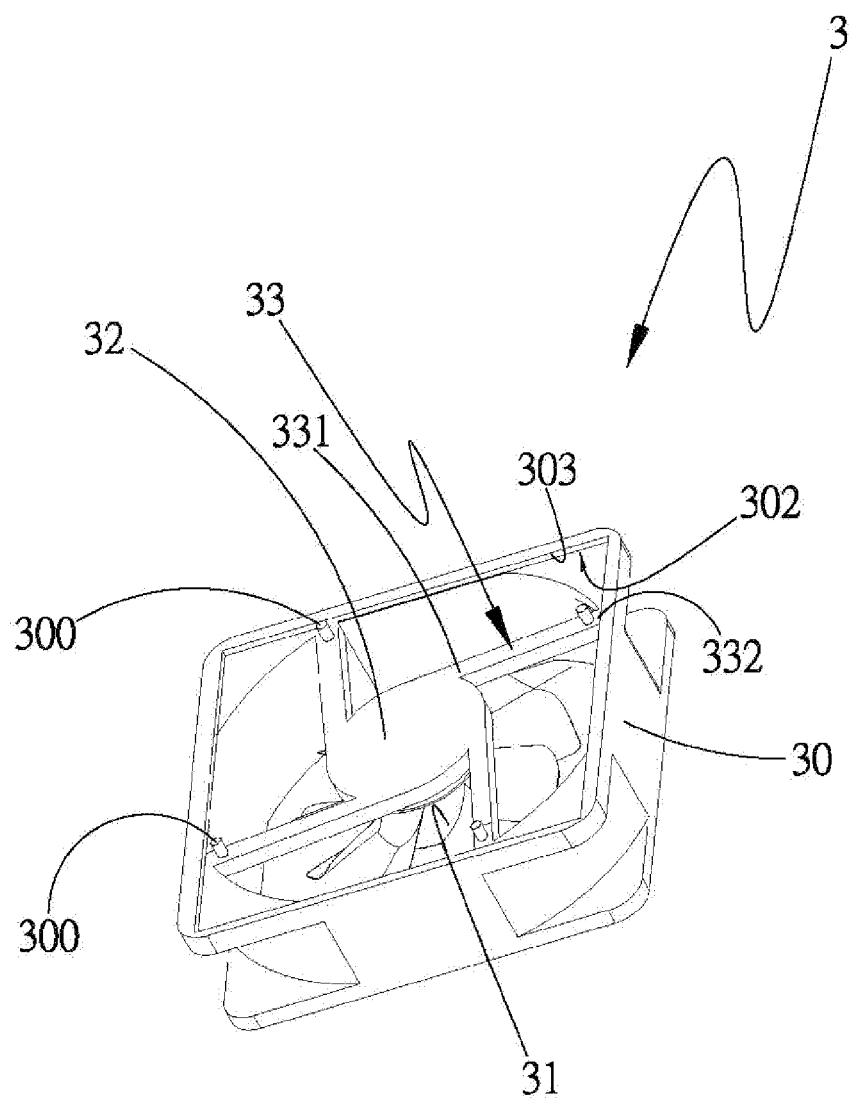
FIG. 6 is a perspective view of a cooling fan included in the first embodiment of the thermal module of the present invention.
Figure 7:
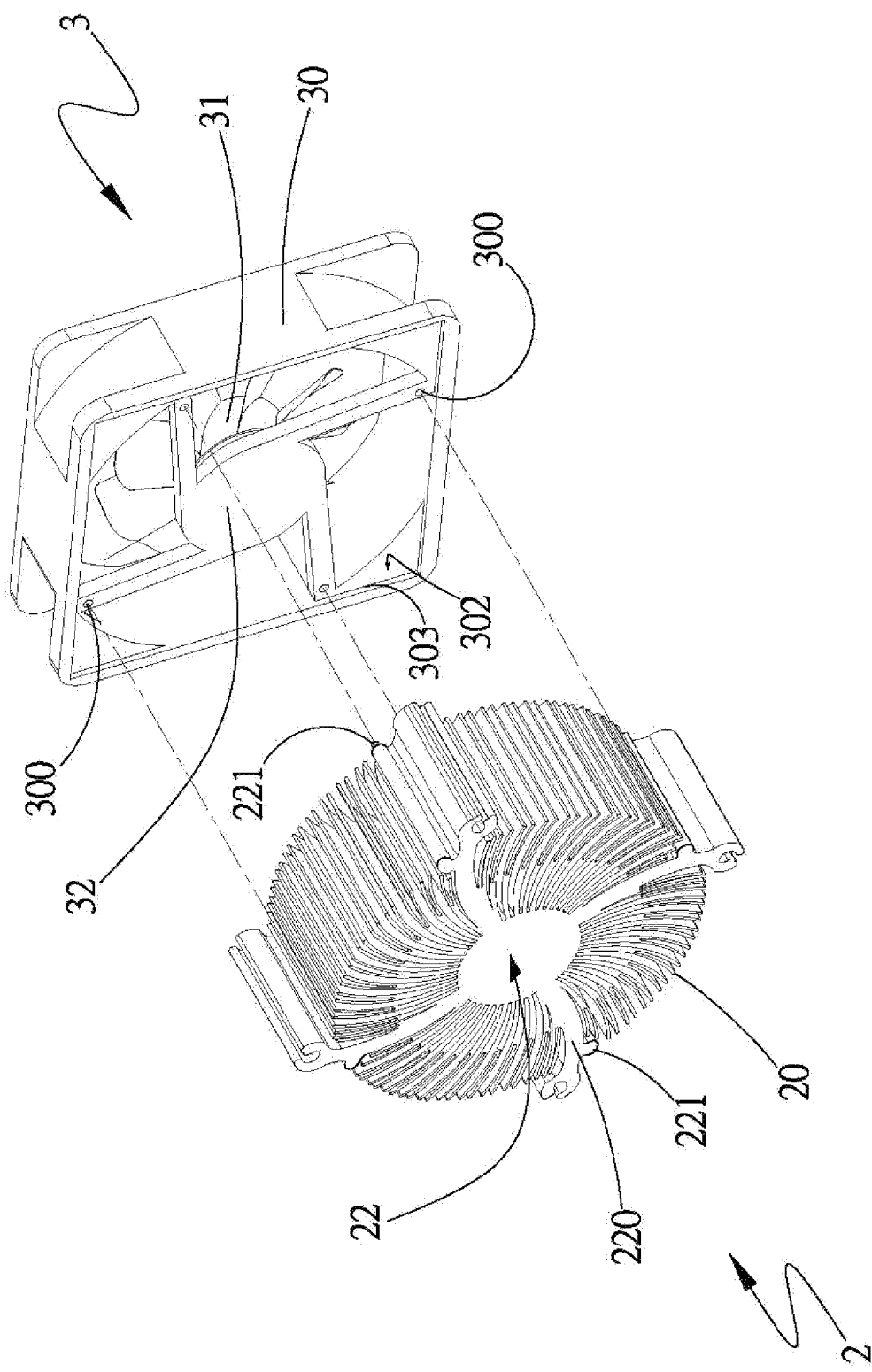
FIG. 7 is an exploded perspective view of a thermal module with quick assembling structure according to a second preferred embodiment of the present invention.
Figure 8:
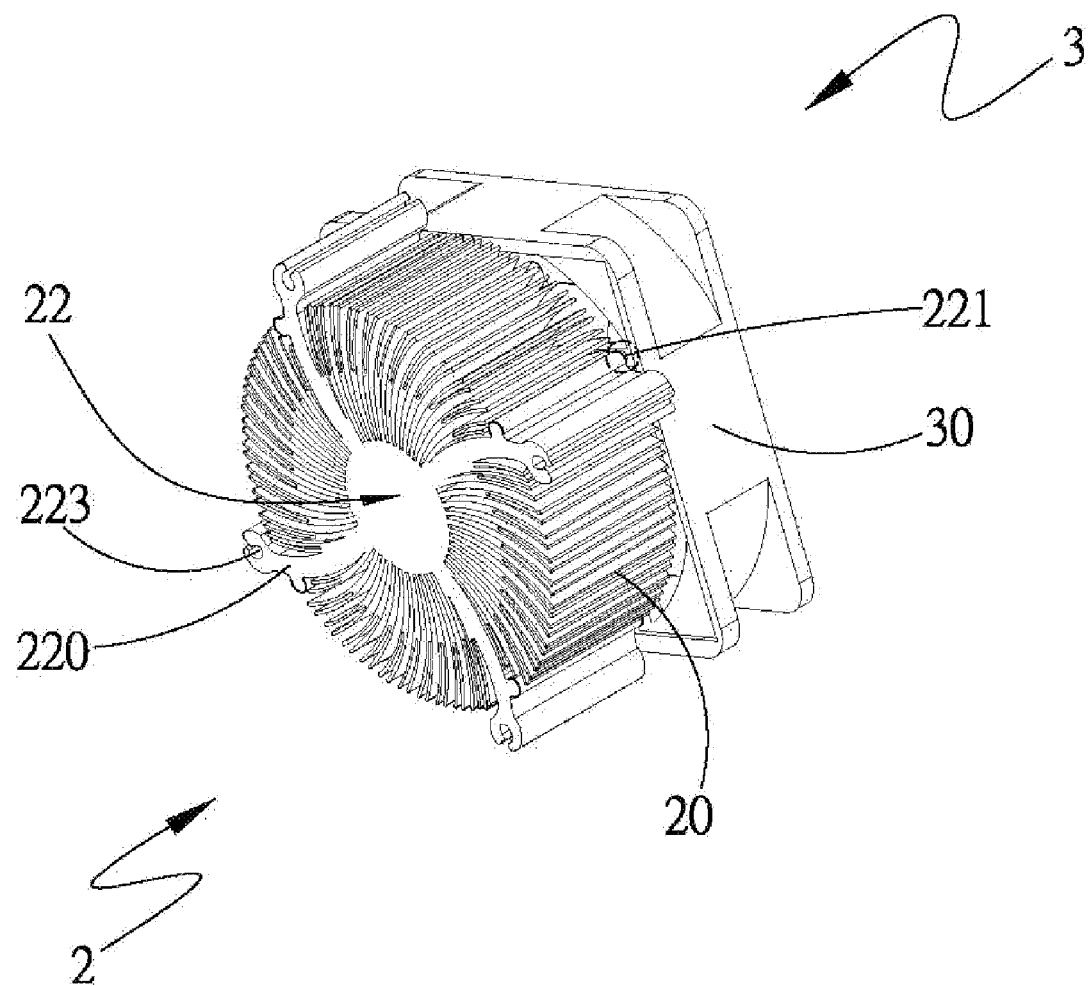
FIG. 8 is an assembled view of FIG. 7.
Figure 8A:
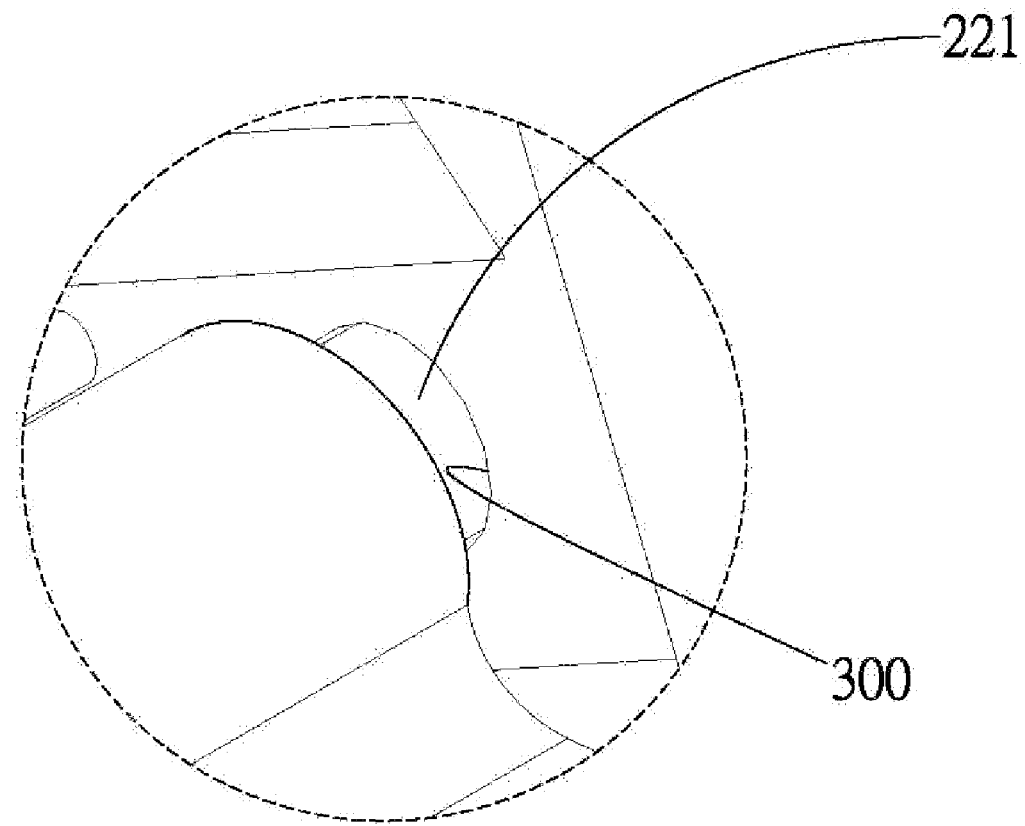
FIG. 8A is an enlarged view of the circled area in FIG. 8.
Figure 9:
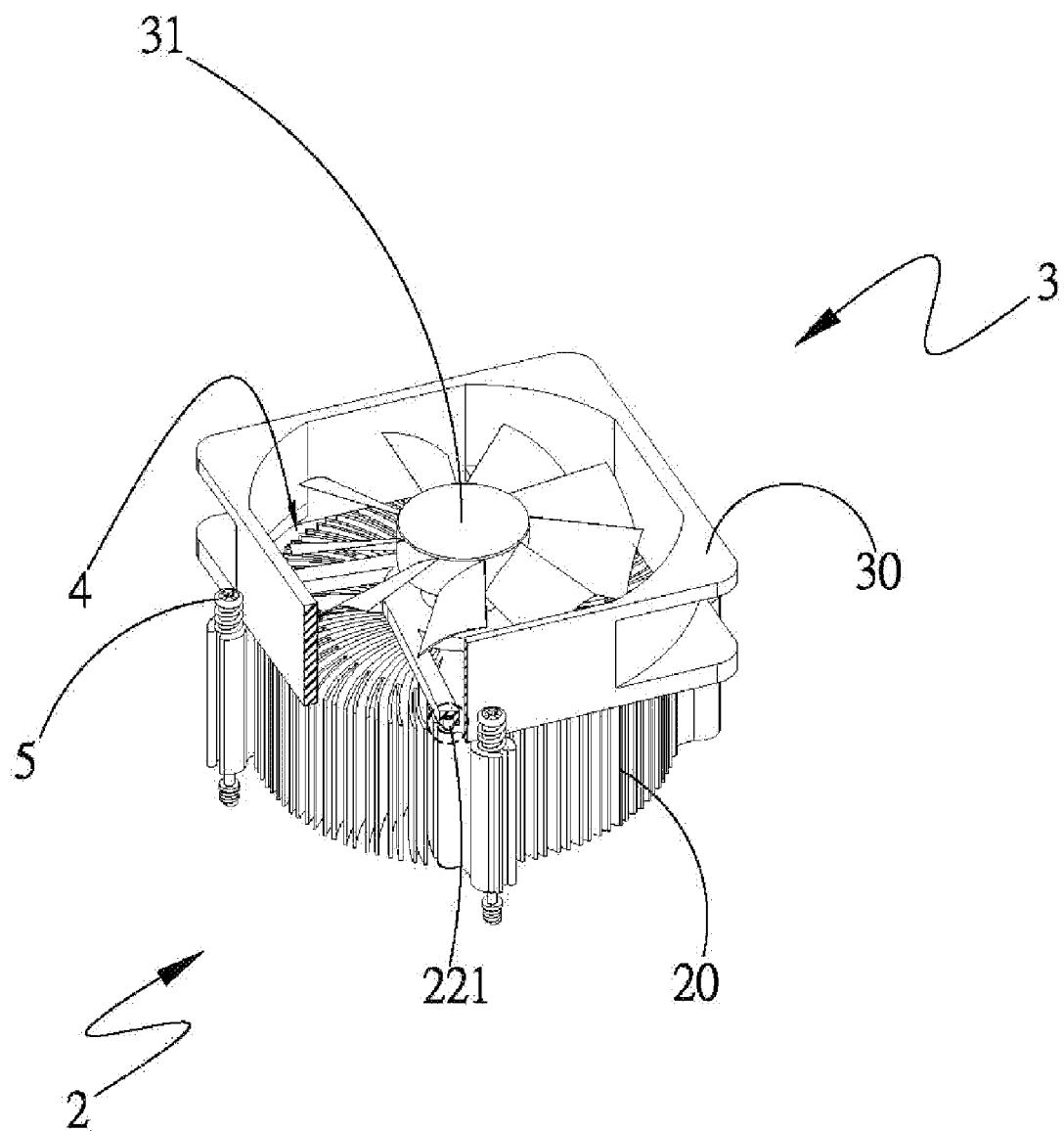
FIG. 9 is a cutaway view of the thermal module according to the second preferred embodiment of the present invention.
Figure 9A:
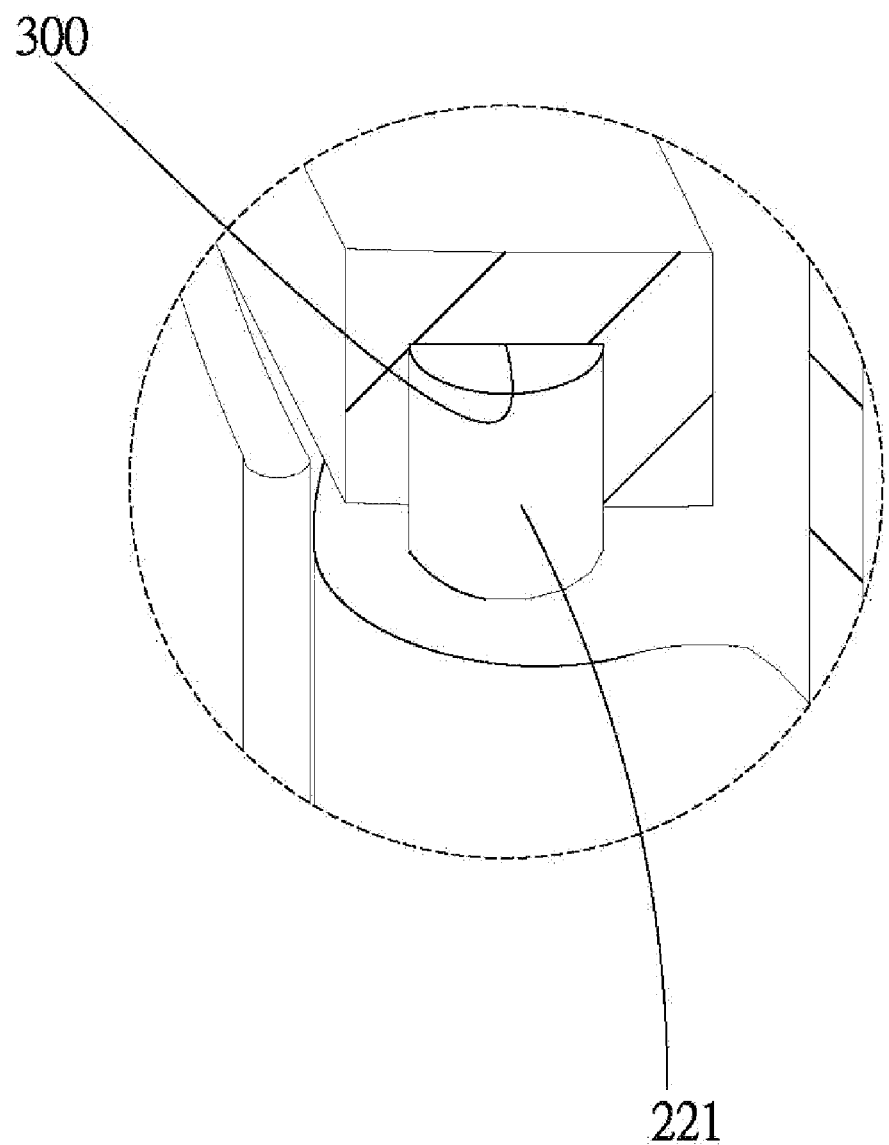
FIG. 9A is an enlarged view of the circled area in FIG. 9.
Figure 10:
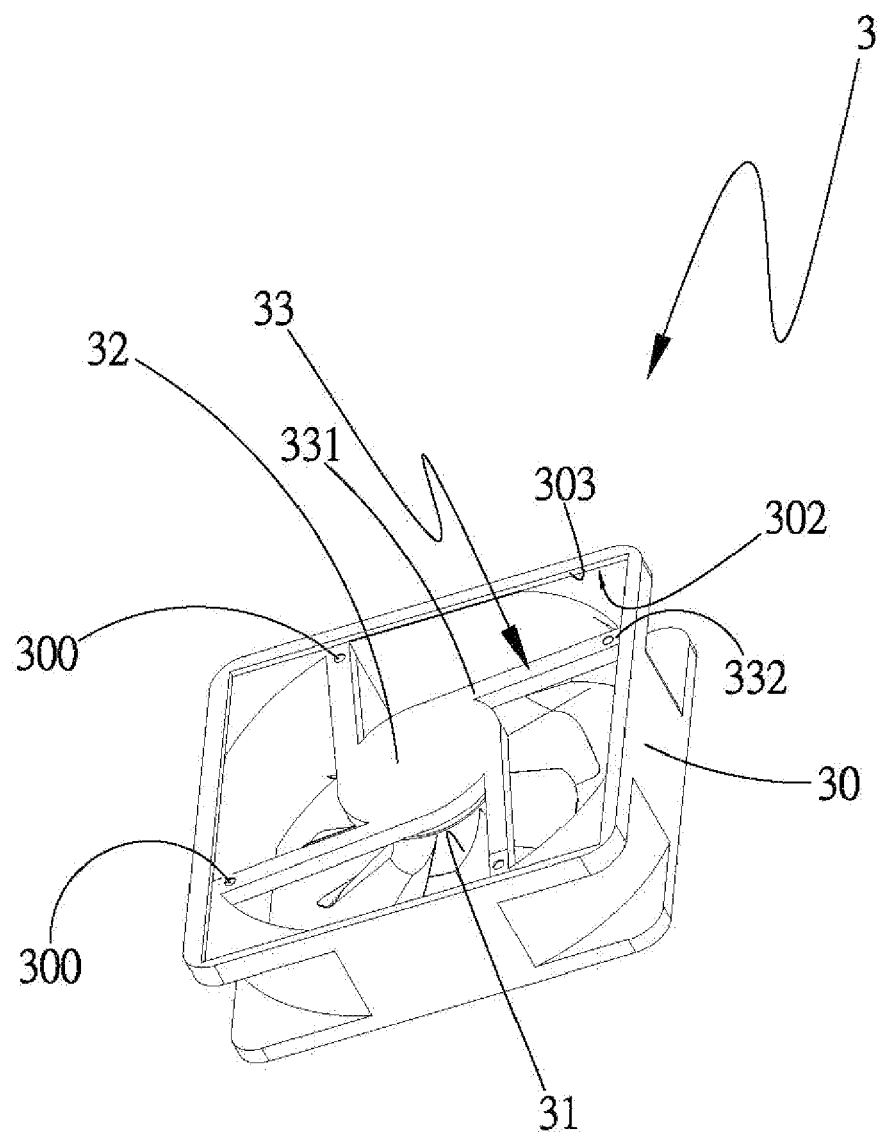
FIG. 10 is a perspective view of a cooling fan included in the second embodiment of the thermal module of the present invention.
Figure 11:
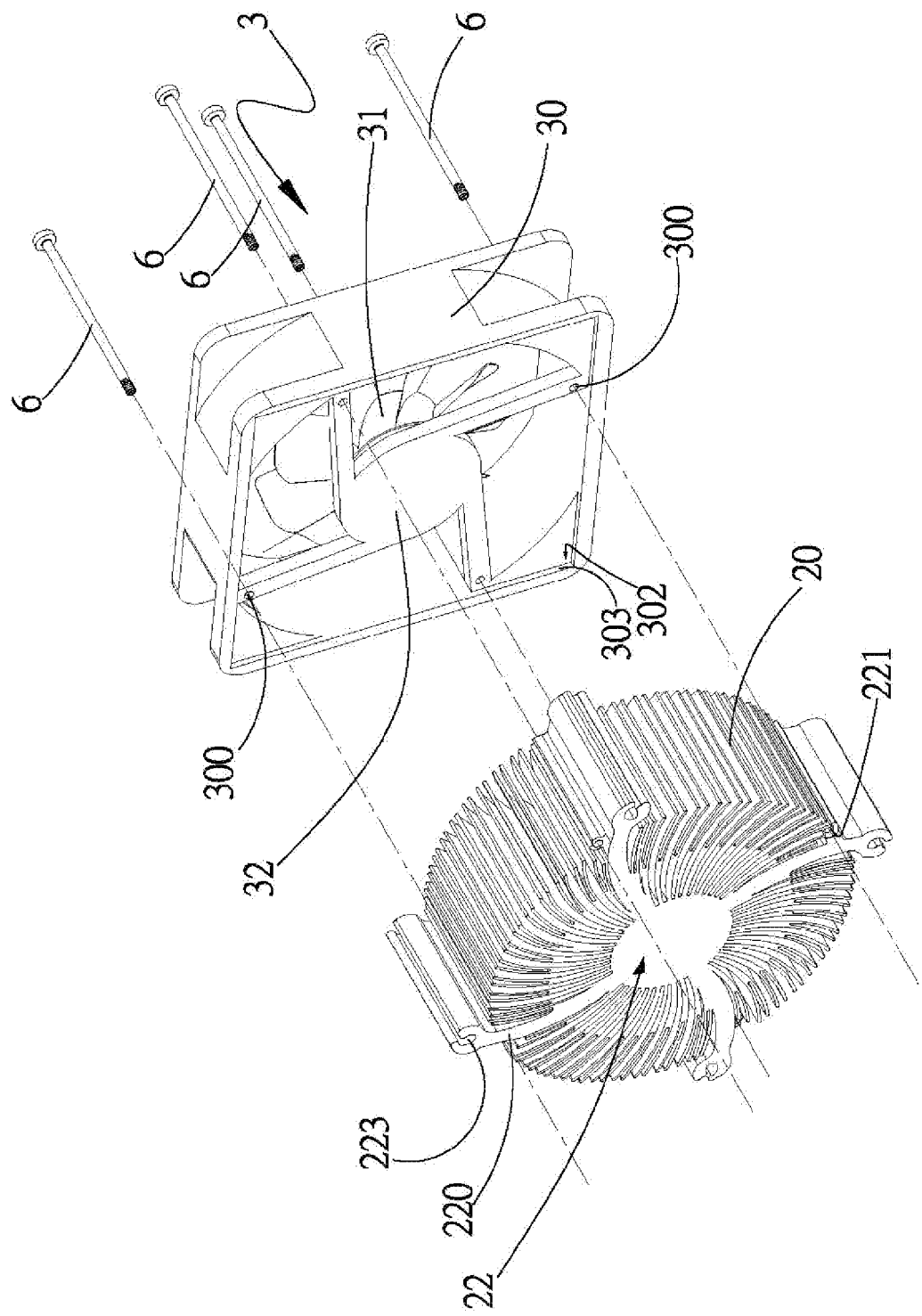
FIG. 11 is an exploded perspective view of a thermal module with quick assembling structure according to a third preferred embodiment of the present invention.
Figure 12:
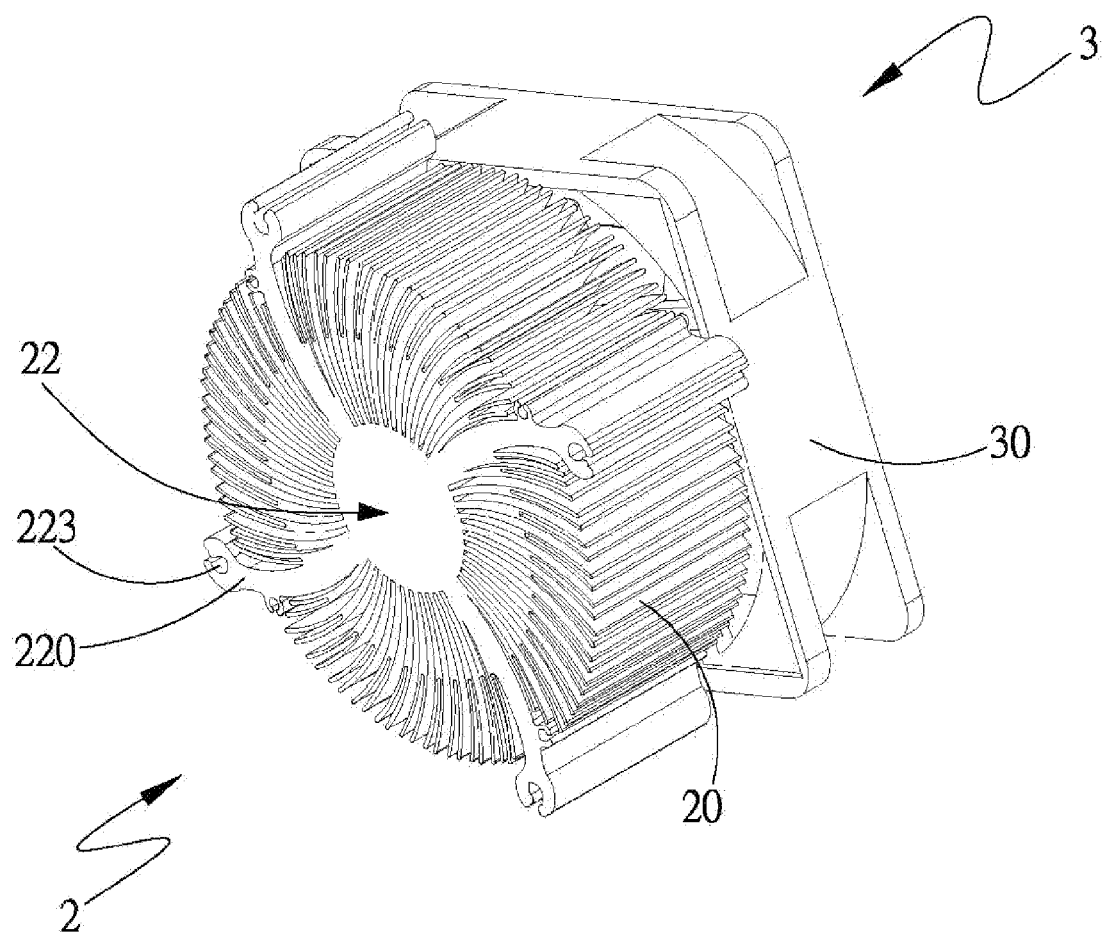
FIG. 12 is an assembled view of FIG. 11.
Figure 13:
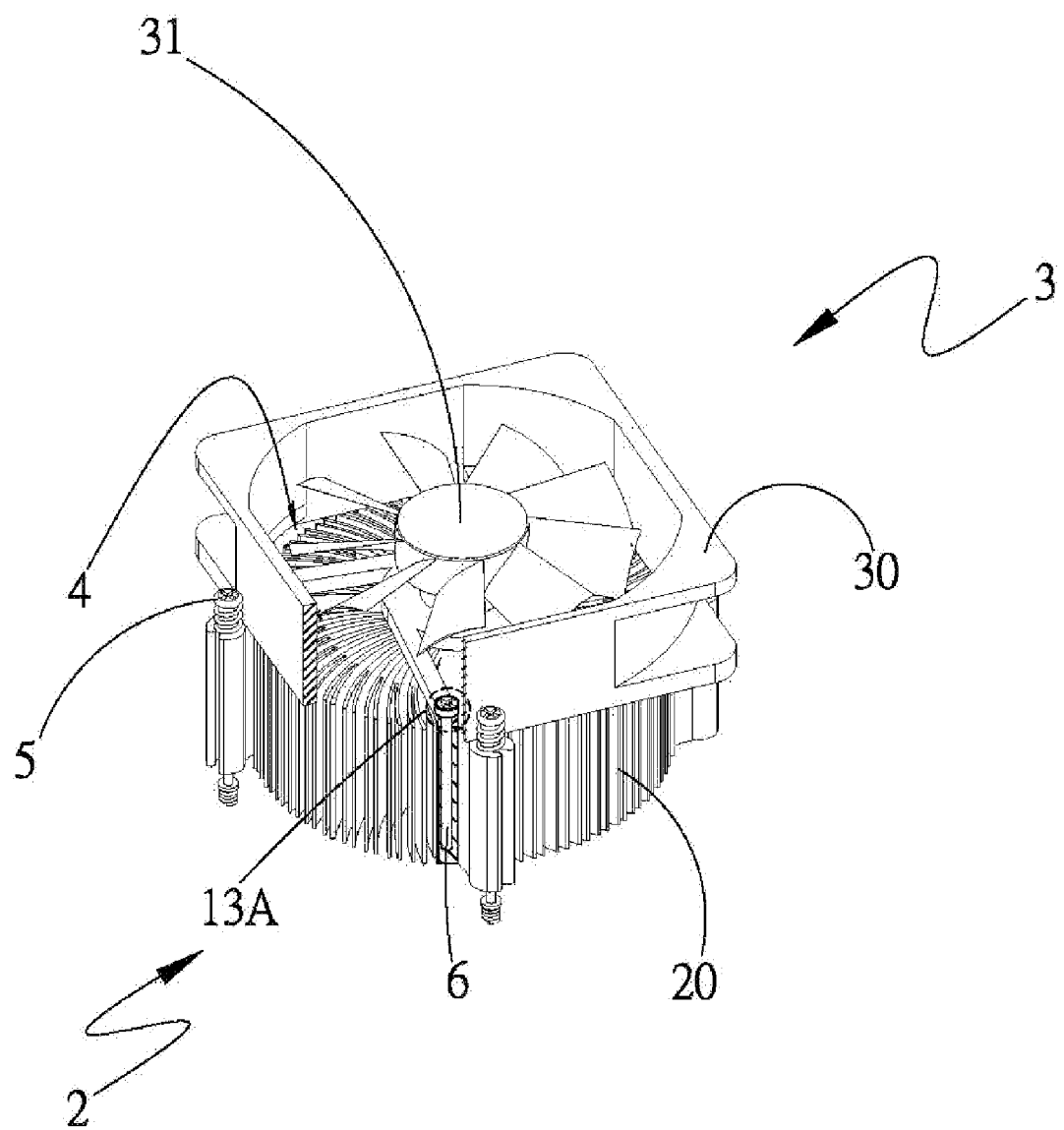
FIG. 13 is a cutaway view of the thermal module according to the third preferred embodiment of the present invention.
Figure 13A:
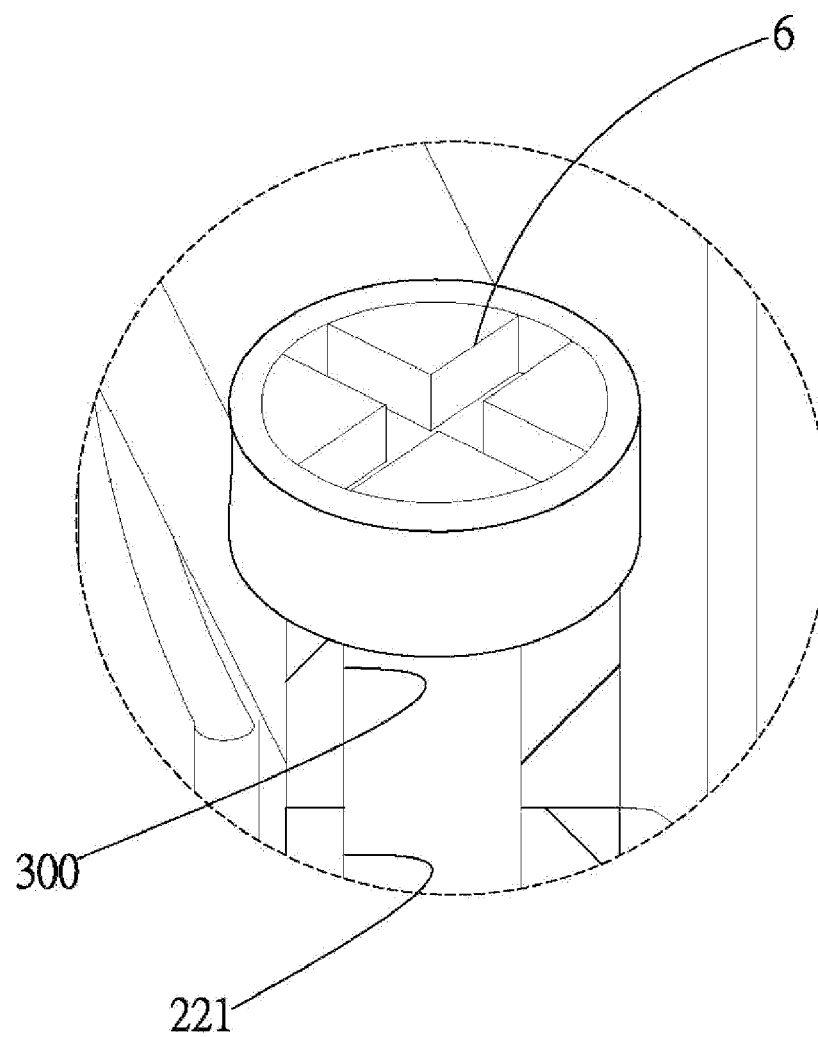
FIG. 13A is an enlarged view of the circled area in FIG. 13.

Please refer to FIGS. 6 and 10. The housing 30 includes a base 32 and a plurality of supporting arms 33. The blade hub 31 is rotatably connected to the base 32 to face away from the heat sink 2. The supporting arms 33 each have a first end 331 connected to the base 32 and a second end 332 connected to an outer frame portion of the housing 30. The second mating part 300 is arranged near the second end 332 of the supporting arm 33.

In the first preferred embodiment of the present invention illustrated in FIGS. 2, 3, 3A, 4, 4A, 5, and 6, the first mating part 221 on the fixing section 220 is a fixing hole, and the second mating part 300 on the housing 30 is a projected post as in the above-mentioned first combination for the first and the second mating part 221, 300.

To assemble and mount the thermal module, simply apply a force against the cooling fan 3 for the second mating part 300 to insert into the first mating part 221 on the heat sink 2, and the cooling fan 3 is connected to the heat sink 2. At this point, the raised wall portion 302 on the housing 30 will press its outer end face 303 against the heat sink 2, so that the above-mentioned space 4 is formed between the air outlet in the cooling fan 3 and the radiating fins 20 of the heat sink 2. In other words, a distance between the cooling fan 3 and the heat sink 2 is increased, which further helps in reducing the impact on the radiating fins 20 by the fluid guided in from the air outlet of the cooling fan 3 and avoiding the loss of static pressure in the thermal module. Then, extend the first fastening element 5 through the corresponding fastening hole 223 into an electronic element, such as a mainboard (not shown), to quickly assemble the thermal module while mounting it to the electronic element.

In brief, the thermal module of the present invention can be assembled in high efficiency to reduce the manufacturing cost and assembling time thereof and provide enhanced heat dissipation performance.

In FIGS. 7, 8, 8A, 9, 9A, and 10, there is illustrated a second preferred embodiment of the present invention. The second embodiment is generally similar to the first embodiment in terms of an overall structure and connection relation among different components thereof, except that, in the second embodiment, the first mating part 221 on the fixing section 220 and the second mating part 300 on the housing 30 are projected post and fixing hole, respectively, as in the above-mentioned second combination for the first and second mating parts 221, 300.

To assemble and mount the thermal module, simply apply a force to push the cooling fan 3 toward the heat sink 2, so that the second mating part 300 is engaged with the first mating part 221 on the heat sink 2, and the cooling fan 3 is connected to the heat sink 2. At this point, the raised wall portion 302 on the housing 30 will press its outer end face 303 against the heat sink 2, so that the above-mentioned space 4 is formed between the air outlet in the cooling fan 3 and the radiating fins 20 of the heat sink 2. In other words, a distance between the cooling fan 3 and the heat sink 2 is increased, which further helps in reducing the impact on the radiating fins 20 by the fluid guided in from the air outlet of the cooling fan 3 and avoiding the loss of static pressure in the thermal module. Then, extend the first fastening element 5 through the corresponding fastening hole 223 into an electronic element, such as a mainboard (not shown), to quickly assemble the thermal module while mounting it to the electronic element. In brief, the thermal module of the present invention can be assembled in high efficiency to reduce the manufacturing cost and assembling time thereof and provide enhanced heat dissipation performance.

In FIGS. 10, 11, 12, 13, and 13A, there is illustrated a thermal module according to a third preferred embodiment of the present invention. The third embodiment is generally similar to the second embodiment in terms of an overall structure and connection relation among different components thereof, except that, in the third embodiment, both of the first mating part 221 on the fixing section 220 and the second mating part 300 on the housing 30 are a fixing hole, as in the above-mentioned third combination for the first and second mating parts 221, 300.

To assemble and mount the thermal module, first align and tightly contact the first mating part 221 with the second mating part 300, and then thread or insert the above-mentioned second fastening element 6 through the aligned fixing holes of the first and the second mating parts 221, 300, so that the cooling fan 3 is firmly and tightly connected to the heat sink 2. At this point, the raised wall portion 302 on the housing 30 will press its outer end face 303 against the heat sink 2, so that the above-mentioned space 4 is formed between the air outlet in the cooling fan 3 and the radiating fins 20 of the heat sink 2. In other words, a distance between the cooling fan 3 and the heat sink 2 is increased, which further helps in reducing the impact on the radiating fins 20 by the fluid guided in from the air outlet of the cooling fan 3 and avoiding the loss of static pressure in the thermal module. Then, extend the first fastening element 5 through the corresponding fastening hole 223 into an electronic element, such as a mainboard (not shown), to quickly assemble the thermal module while mounting it to the electronic element. In brief, the thermal module of the present invention can be assembled in high efficiency to reduce the manufacturing cost and assembling time thereof and provide enhanced heat dissipation performance.

With the above arrangements, the thermal module with quick assembling structure according to the present invention provides the following advantages:

1. Unlike the conventional thermal module, the cooling fan and the heat sink of the thermal module of the present invention can be assembled together without the need of an additional mounting rack or bridging member, enabling the present invention to be assembled in high efficiency.
2. With the mounting rack or bridging member omitted from the thermal module, the present invention can be manufactured and assembled at reduced material, labor, and time costs.
3. With the raised wall portion provided on the housing of the cooling fan, the distance between the cooling fan and the heat sink is increased to thereby reduce the impact on the radiating fins by the fluid guided in by the cooling fan and avoid the noise produced during the operation of the thermal module.
4. When the outer end face of the raised wall portion is pressed against the heat sink, a sealed space is formed between the cooling fan and the heat sink to help in avoiding loss of static pressure in the thermal module and enhancing the heat dissipation efficiency of the thermal module.

The present invention has been described with some preferred embodiments thereof and it is understood that many changes and modifications in the described embodiments can be carried out without departing from the scope and the spirit of the invention that is intended to be limited only by the appended claims.

What is claimed is:

1. A thermal module with quick assembling structure, comprising:
   a heat sink including a plurality of radiating fins and a main body; at least one fixing section being outward extended from an outer periphery of the main body, and the fixing section being provided at one lateral side thereof with at least one first mating part; the radiating fins being outward extended from the outer periphery of the main body to space from one another, and being divided by the least one fixing section into groups, each of which is located between two adjacent fixing sections; and
   a cooling fan including a housing and a blade hub arranged in the housing; the housing being provided at one side facing toward the heat sink with at least one second mating part and an axially raised wall portion, the second mating part being corresponding to the first mating part, and the raised wall portion having an axially outer end face for pressing against the heat sink to thereby define a space between the cooling fan and the heat sink, wherein the housing includes a base and a plurality of supporting arms; the blade hub being rotatable connected to one side of the base to face away from the heat sink; the supporting arms each having a first end connected to the base and a second end connected to an outer frame portion of the housing; and the at least one second mating part being provided near the second end of one supporting arm corresponding to the at least one first mating part.

2. The thermal module with quick assembling structure as claimed in claim 1, wherein the fixing section has an inner end connected to the main body and an outer end formed into a fastening hole for engaging with a first fastening element.

3. The thermal module with quick assembling structure as claimed in claim 1, wherein the first mating part can be any one a fixing hole and a projected post, and the second mating part can be any one of a projected post and a fixing hole corresponding to the fixing hole and the projected post, respectively, of the first mating part.

4. The thermal module with quick assembling structure as claimed in claim 1, wherein the first mating part and the second mating part each are a fixing hole, and at least one second fastening element can be extended through the two fixing holes to connect the first mating part and the second mating part to each other.

5. The thermal module with quick assembling structure as claimed in claim 4, wherein the second fastening element is screwed through the first mating part and the second mating part to connect the two parts to each other.

6. The thermal module with quick-assembling structure as claimed in claim 4, wherein the second fastening element is inserted through the first mating part into the second mating part to connect the two parts to each other.

7. The thermal module with quick assembling structure as claimed in claim 4, wherein the second fastening element is selected from the group consisting of a screw and an insertion pin.

8. The thermal module with quick assembling structure as claimed in claim 1, wherein the first and the second mating part are integrally formed on the fixing section and the housing, respectively.

* * * * *